(12) United States Patent
Onishi et al.

(10) Patent No.: US 7,195,936 B2
(45) Date of Patent: Mar. 27, 2007

(54) THIN FILM PROCESSING METHOD AND SYSTEM

(75) Inventors: Tadashi Onishi, Nirasaki (JP); Manabu Hama, Nirasaki (JP); Minoru Honda, Nirasaki (JP); Kazuyuki Mitsuoka, Nirasaki (JP); Mitsuaki Iwashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/745,520

(22) Filed: Dec. 29, 2003

(65) Prior Publication Data

US 2004/0137760 A1 Jul. 15, 2004

(30) Foreign Application Priority Data

Dec. 27, 2002 (JP) ............................. 2002-381591
Mar. 11, 2003 (JP) ............................. 2003-064855

(51) Int. Cl.
*H01L 21/00* (2006.01)
(52) U.S. Cl. .................. 438/16; 438/782; 438/788; 257/E21.242; 250/492.23; 250/492.3
(58) Field of Classification Search ................ 438/16, 438/761, 782, 788; 257/E21.242; 250/492; 427/255, 569; 324/702, 716, 751; 313/361
See application file for complete search history.

(56) References Cited

U.S. PATENT DOCUMENTS

| | | | | |
|---|---|---|---|---|
| 3,617,740 A | * | 11/1971 | Skillicorn | .................. 250/492.3 |
| 5,414,267 A | * | 5/1995 | Wakalopulos | ............. 250/492.3 |
| 6,545,398 B1 | * | 4/2003 | Avnery | ...................... 313/361.1 |
| 6,850,079 B2 | * | 2/2005 | Yamada et al. | .............. 324/702 |
| 2002/0074519 A1 | * | 6/2002 | Yamaguchi | ............... 250/492.1 |
| 2003/0143847 A1 | * | 7/2003 | Miyajima et al. | ........... 438/689 |
| 2004/0013817 A1 | * | 1/2004 | Mizutani et al. | ............. 427/569 |

FOREIGN PATENT DOCUMENTS

| | | | | |
|---|---|---|---|---|
| JP | 61194177 A | * | 8/1986 | |
| JP | 03188267 A | * | 8/1991 | |
| JP | 04265180 A | * | 9/1992 | |
| JP | 05287531 A | * | 11/1993 | |
| JP | 2000096232 A | * | 4/2000 | |
| JP | 2002-329719 | | 11/2002 | |
| KR | 2002-0046928 | | 6/2002 | |
| WO | WO 9636070 A2 | * | 11/1996 | |

* cited by examiner

*Primary Examiner*—B. William Baumeister
*Assistant Examiner*—Igwe U. Anya
(74) *Attorney, Agent, or Firm*—Oblon, Spivak, McClelland, Maier & Neustadt, P.C.

(57) ABSTRACT

In a thin film processing method and system, a film thickness is regulated by using electron beams irradiated from a plurality of electron beam tubes onto a film of varying thickness formed on an object to be processed, wherein the output powers or beam irradiation times of the electron beam tubes are individually controlled according to a distribution of the thickness. In the method and system, electric charges charged in a film of an object to be processed can be removed also.

7 Claims, 7 Drawing Sheets

THIN FILM PROCESSING METHOD AND SYSTEM

FIELD OF THE INVENTION

The present invention relates to a thin film processing method and system; and, more particularly, to a thin film processing method and system capable of processing a thin film to provide a uniform film thickness and removing electric charges charged in a film in the course of using a plasma processing apparatus or the like.

BACKGROUND OF THE INVENTION

In response to large integration and development of high-speed semiconductor devices, wiring structure thereof is becoming finer; and, as a result, achieving a high-definition of a wiring pattern in a resist film and reducing electrical capacitance among wirings have become more important. Achieving such high-definition of wiring pattern requires a uniform thickness of the resist film. Further, a uniform thickness of an interlayer insulating film is required for an accurate etching process.

Widely used in forming the resist film or the interlayer insulating film is a spin coating technique where, e.g., a coated insulating film (referred to as SOD (spin on dielectric) film hereinafter) is formed by coating an organic material on a surface of an object to be processed by using a spin coater and a bake oven. In order to reduce the interwiring capacitance of the interlayer insulating film, various low-k film materials have been developed as SOD film materials. As one of the steps of film forming, heat curing is performed on the SOD film. And recently, an electron beam (EB) curing process is performed thereon by using an EB processor.

Figure 9A:
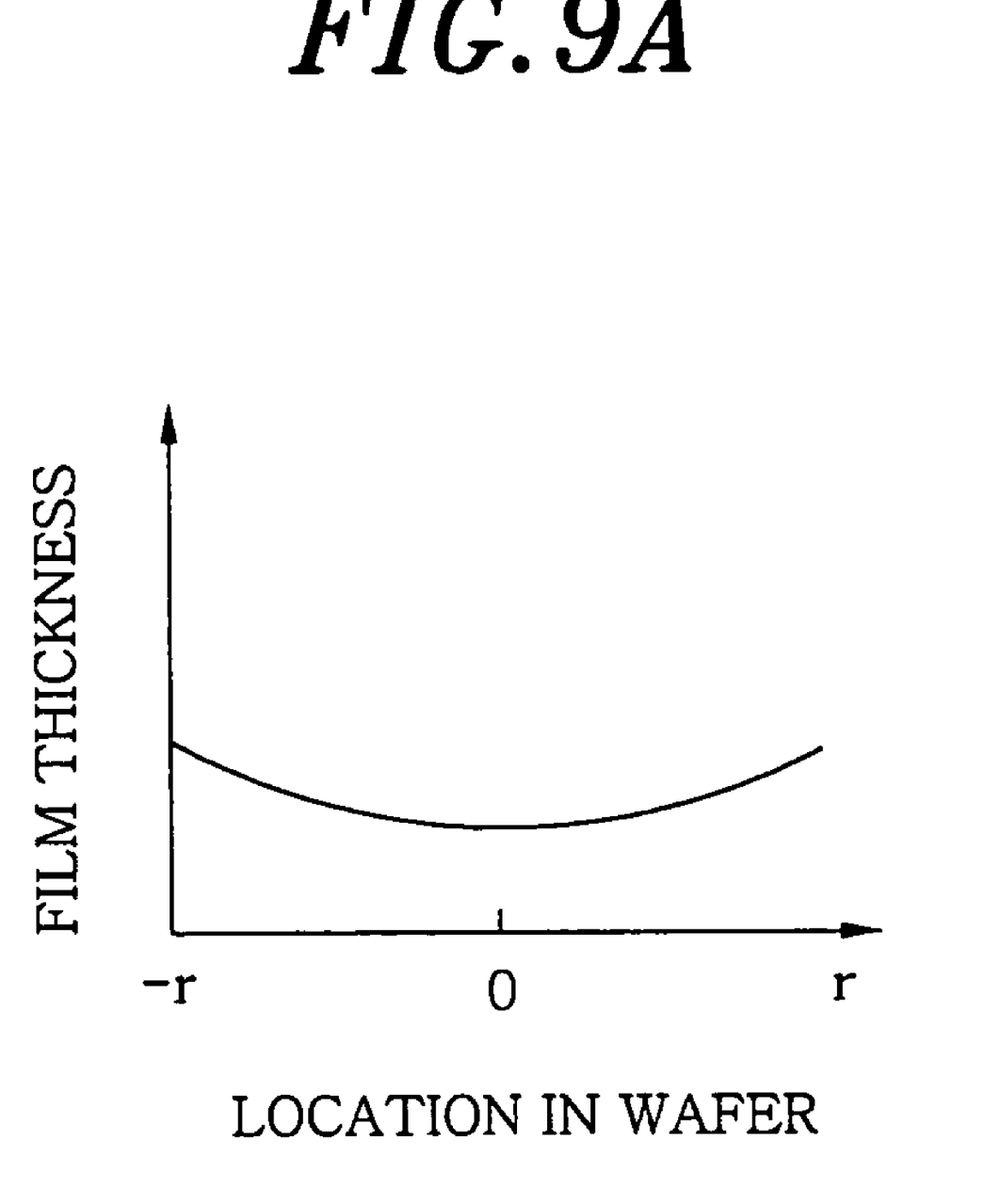
FIGS. 9A to 9C set forth graphs depicting a thickness distribution of the SOD film on a wafer obtained before and after a conventional EB curing process and an output of a conventional electron beam unit, which correspond to FIGS. 6A to 6C, respectively.
Figure 9B:
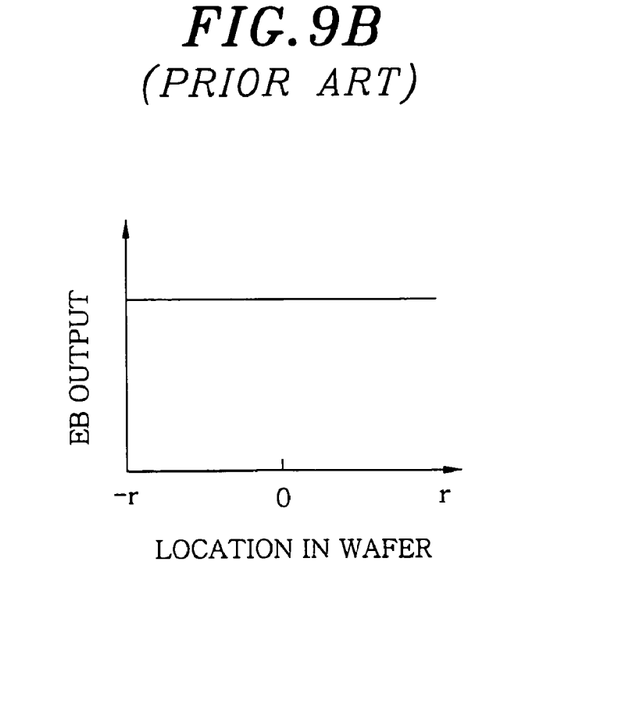

In case of forming the SOD film on an object to be processed (e.g., a wafer) by using the spin coater, a center portion of the wafer has a comparatively small thickness and the thickness of the wafer becomes greater toward an outward radial direction thereof, as illustrated in FIG. 9A. Conventionally, while the EB curing process is performed on the SOD film, each of electron beam tube emits a uniform output of electron beams to an entire surface of the wafer, as shown in FIG. 9B.

Although the irregularity of the film thickness in case of forming a thin film such as an interlayer insulating film on a wafer by using a plasma processing apparatus is not as great as that of using the spin coater, the irregularity nevertheless makes it difficult to achieve a uniform film thickness. Moreover, in case of forming the thin film by using a plasma processing apparatus, the thin film may suffer from an onset of electric charges from a plasma, causing various processing problems in subsequent processes. The charging problem may also occur during an etching process.

Therefore, there have been proposed various methods for removing electric charges from a thin film, e.g., a method of neutralizing positive ions on the thin film by irradiating electron beam (negative ions) onto a wafer (claim 1 to 3, paragraph [0007], and FIG. 2 of Japanese Patent Laid-Open Publication No. H9-181056); and a method for generating floating electric charges (including positive ions and electrons) from Ar gas or the like by using a neutralizing electric charge generator such as an ultraviolet lamp and then neutralizing electric charges on a surface of a thin film by using thus generated floating electric charges (claims 1 and 2, and paragraph [0022] of Japanese Patent Laid-Open Publication No. H7-14761). In addition, there is known a method for removing electric charges from a surface of a semiconductor substrate by irradiating ultraviolet to a charge accumulated region of the surface of semiconductor substrate (claims 1 and 4, paragraph [0008] of Japanese Patent Laid-Open Publication No. H5-243160).

Figure 9C:
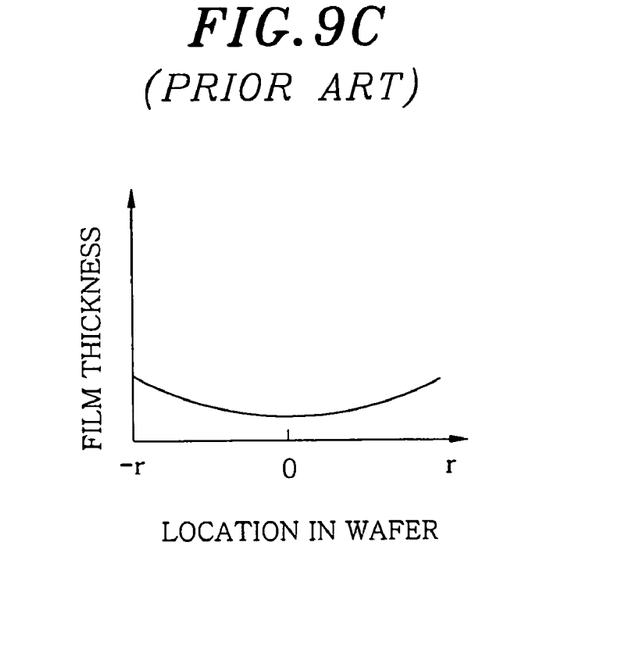

However, in the conventional thin film forming process of a resist film or interlayer insulating film, which involves the SOD film coating process, the SOD film baking process and the curing process described above, there is a tremendous difficulty in achieving a uniform film thickness in every process. For example, in case of coating the SOD film by using a spin coater, the film thickness becomes nonuniform as shown in FIG. 9A and such nonuniformity can not be corrected even after a heat treatment using a bake oven and an EB curing process. Therefore, nonuniformity in the film thickness prevails even after the EB curing process as shown in FIG. 9C, making it difficult to obtain a uniform thickness. Moreover, if the film thickness is nonuniform, it becomes difficult to perform succeeding processes. For instance, when the interlayer insulating film is processed, such nonuniformity hampers an accurate etching of a desired pattern and deterioration of yield may result. Further, when the resist film is processed, it is difficult to achieve a highly detailed patterning required in an exposure process.

In case of employing the first prior art method, discussed above, for removing electric charges from a thin film formed on a wafer surface, only positive ions of the thin film can be removed by the electron beam (negative ions). In case of adopting the second prior art method using ultraviolet, it may be possible to remove electric charges from the surface of the thin film; however, electric charges generated by the ultraviolet cannot penetrate into the thin film, and, therefore, electric charges accumulated inside the thin film cannot be removed. The third prior art method is also saddled with the same problem since the ultraviolet may not be able to penetrate into the thin film.

SUMMARY OF THE INVENTION

It is, therefore, an object of the present invention to provide a thin film processing method and a system capable of obtaining a uniform thickness of a thin film and removing electric charges accumulated in an object to be processed.

In accordance with a primary aspect of the invention, there is provided a thin film processing method including the step of irradiating electron beams form a plurality of electron beam tubes onto a film formed on an object to be processed, the film having a varying thickness, to regulate the thickness, wherein output powers or beam irradiation times of the electron beam tubes are individually controlled according to a distribution of the thickness.

In accordance with a second aspect of the invention, there is provided a thin film processing method including the steps of: measuring a thickness of a film formed on a surface of an object to be processed; and regulating the thickness by irradiating electron beams from a plurality of electron beam tubes on the film, wherein output powers or beam irradiation times of the electron beam tubes are individually controlled based on a measurement result of the thickness.

In accordance with a third aspect of the invention, there is provided a thin film processing method including the step of removing electric charges charged in a film of an object to be processed by irradiating electron beams from a plurality of electron beam tubes onto the object, wherein the object is disposed in an atmosphere of a noble gas, and the electron beams are irradiated onto the object through the noble gas.

In accordance with a fourth aspect of the invention, there is provided a thin film processing method including the steps of: measuring the amount of electric charges charged in a film of an object to be processed; and removing the electric charges by irradiating electron beams from a plurality of electron beam tubes onto the film based on a measurement result of the amount of electric charges, wherein the object is disposed in an atmosphere of a noble gas and the electron beams are irradiated onto the object through the noble gas.

In accordance with a fifth aspect of the invention, there is provided a thin film processing system including: a film thickness measuring device for measuring a thickness of a film formed on an object to be processed; and an electron beam processor including a plurality of electron beam tubes for irradiating electron beams onto the film of the object and a controller for individually controlling output powers or beam irradiation times of the electron beam tubes based on a measurement result taken by the film thickness measuring device.

In accordance with a sixth aspect of the invention, there is provided a thin film processing system including: an electric charge measuring device for measuring the amount of electric charges charged in a film of an object to be processed; and an electron beam processor including a plurality of electron beam tubes for removing the electric charges by irradiating electron beams onto the object, wherein the electron beam processor further includes a processing chamber, a gas supply unit for supplying a noble gas into the processing chamber, and a controller for controlling output powers or beam irradiation times of the electron beam tubes based on a measurement result taken by the electric charge measuring device, the electron beams being irradiated onto the object through the noble gas.

BRIEF DESCRIPTION OF THE DRAWINGS

The above and other objects and features of the present invention will become apparent from the following description of preferred embodiments, given in conjunction with the accompanying drawings, in which:

FIGS. 6A to 6C present graphs for depicting processing data on the SOD film obtained by using a thin film processing method in accordance with the preferred embodiment of the present invention, wherein

DETAILED DESCRIPTION OF THE PREFERRED EMBODIMENTS

The present invention will now be described primarily based on preferred embodiments illustrated in FIGS. 1 to 8.

Figure 3:
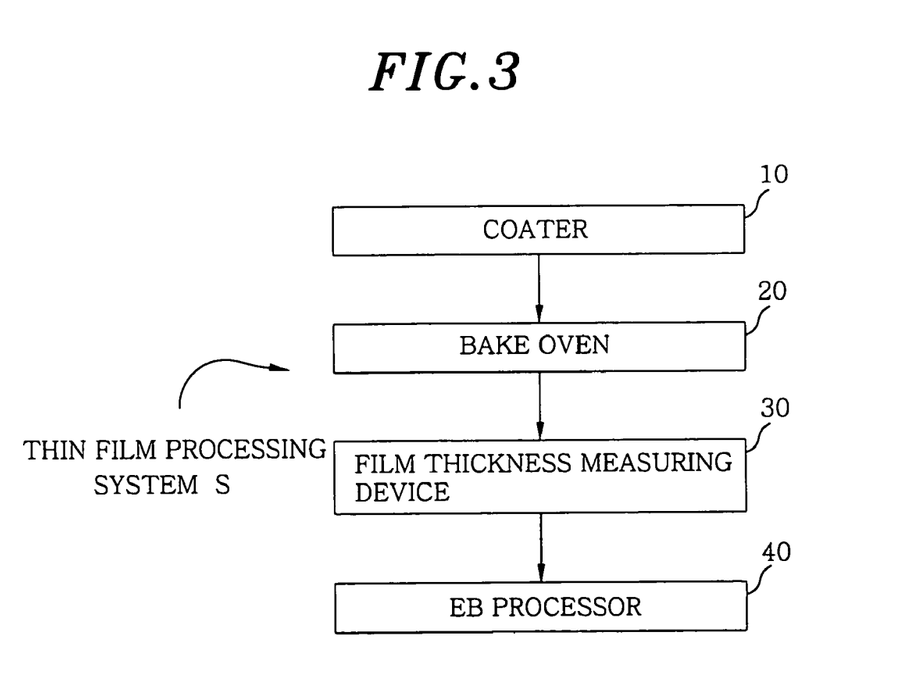
FIG. 3 describes a block diagram of the thin film processing system in accordance with a preferred embodiment of the present invention.

As illustrated in FIG. 3, a thin film processing system S in accordance with a preferred embodiment of the present invention includes a rotary coating device (spin coater) 10 for coating an SOD film on an object to be processed (e.g., a wafer); a bale oven 20 for performing a heat treatment of the SOD film formed on the wafer by the spin coater 10; a film thickness measuring device 30 for measuring a thickness of the SOD film after the heat treatment by the bake oven 20; and an electron beam processor (EB processor) 40 for irradiating electron beams onto the SOD film according to the measurement result of the film thickness measuring device 30. The spin coater 10, bake oven 20, and film thickness measuring device 30 used herein can be those conventionally used in the art.

As described above, the SOD film formed by using the spin coater 10 gradually thickens from a center portion of the wafer toward an outward radial direction. Such nonuniformity in the film thickness is not remedied even after processing the wafer in the bake oven 20. Therefore, in this preferred embodiment, the EF processor 40, described below in detail, is used for performing an EB curing process on the SOD film to obtain a uniform thickness thereof.

Figure 1:
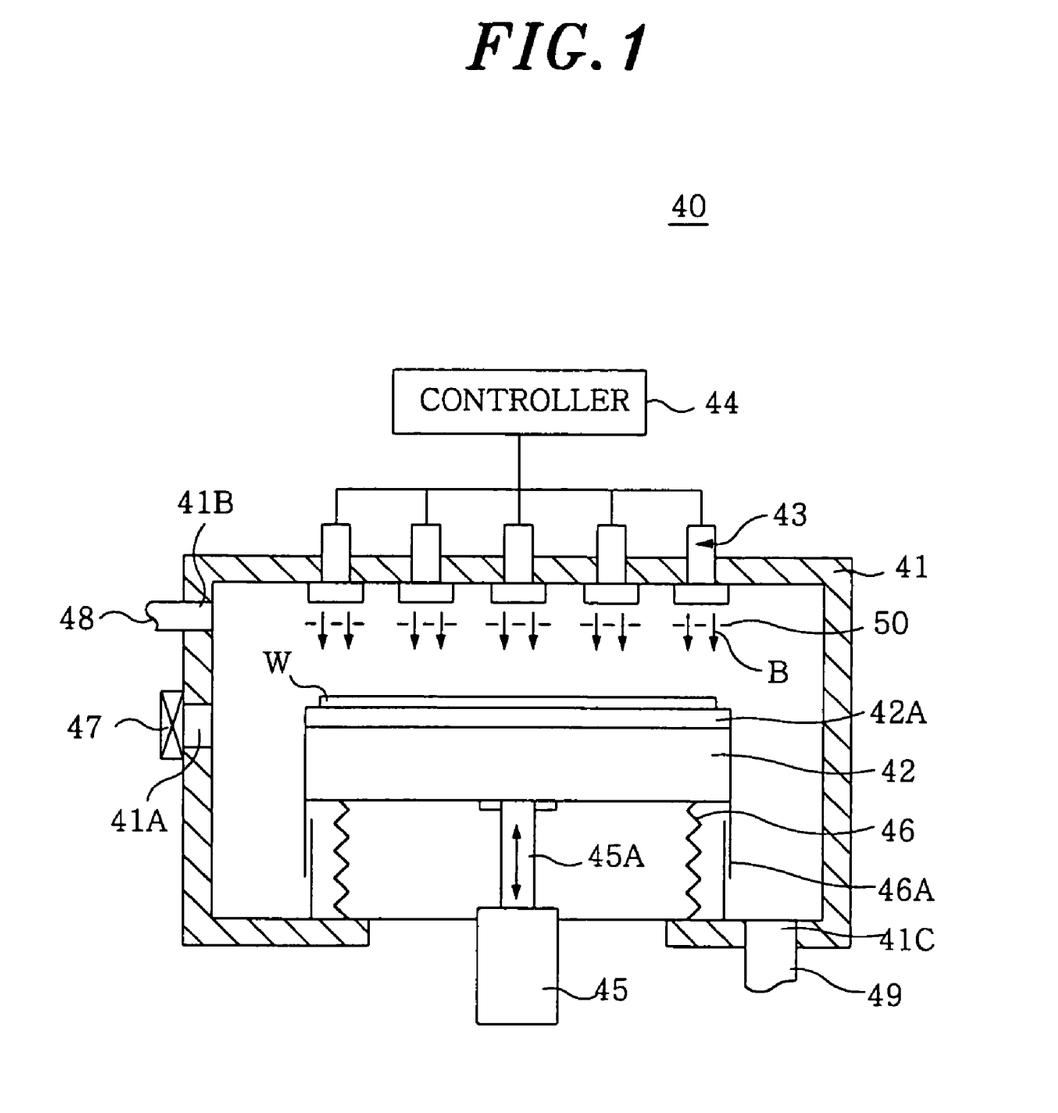
FIG. 1 shows an electron beam (ESB) processor for use in a thin film processing system of the present invention.

As shown in FIG. 1, the EB processor 40 used in this preferred embodiment includes, e.g., a processing chamber 41 made of aluminum or the like capable of being depressurized; a mounting table 42, installed on a central bottom portion of the processing chamber 41, for mounting an object to be processed (a wafer W); an electron beam unit 43 formed of a plurality of, e.g., 19, electron beam tubes substantially concentrically installed on a top surface of the processing chamber 41 facing the mounting table 42; and a controller 44 for controlling the mounting table 42, the electron beam unit 43 and so on. The EB curing process of the SOD film formed on the wafer W is performed by irradiating electron beams from the electron beam unit 43 onto the entire surface of the wafer W mounted on the mounting table 42 under the control of the controller 44. The SOD film is shrunk by the EB curing process as will be described later. In this way, a uniform thickness of the SOD film can be obtained in this preferred embodiment.

An elevation mechanism 45 is connected to a bottom surface of the mounting table 42, and the mounting table 42 is vertically movable by a ballscrew 45A of the elevation mechanism 45. The bottom surface of the mounting table 42 is connected to an inner bottom surface of the processing chamber 41 by extensible/contractible bellows 46 made of stainless steel, the bellows 46 being used for hermetically maintaining the processing chamber 41. Further, a loading/unloading opening 41A of the wafer W is formed at a sidewall of the processing chamber 41, and a gate valve 47 that is able to be opened and closed is installed to the loading/unloading opening 41A. A gas supply port 41B is installed above the loading/unloading opening 41A at a sidewall of the processing chamber 41, and a gas exhaust port 41C is provided at the bottom surface of the processing chamber 41. The gas supply port 41B is connected to a gas supplier (not shown) via a gas supply line 48. Further, the gas exhaust port 41C is connected to a vacuum pump (not shown) via a gas exhaust line 49. Reference numeral 46A in FIG. 1 indicates a bellows cover.

Figure 2:
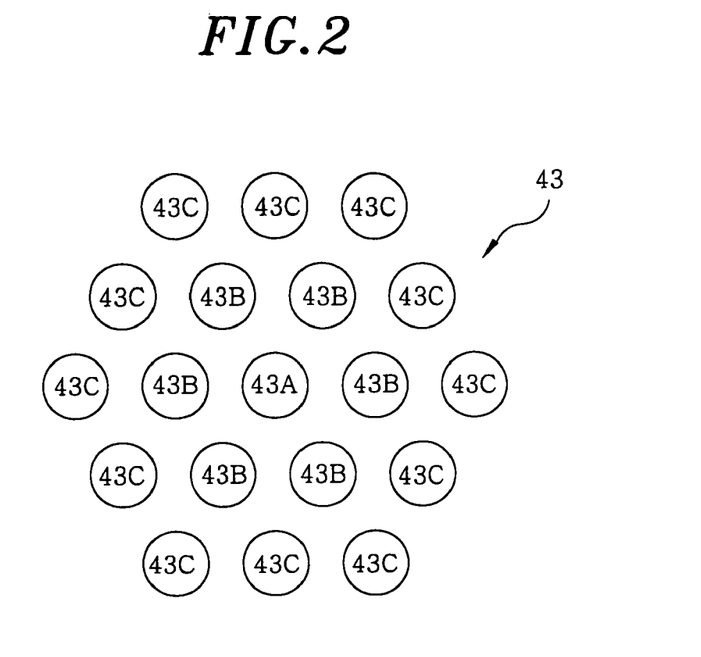
FIG. 2 illustrates a schematic top view of an exemplary arrangement of electron beam tubes of the EB processor shown in FIG. 1.

The mounting table 42 has a heater 42A on a top surface thereof, wherein the heater 42A is used for heating the wafer up to a desired temperature. As can be seen from FIG. 2, the 19 electron beam tubes of the electron beam unit 43 are preferably divided into, e.g., groups of: one first electron beam tube 43A installed on a center of the top surface of the processing chamber 41; six second electron beam tubes 43B substantially concentrically arranged around the first electron beam tube 43A; and twelve third electron beam tubes 43C concentrically provided around the second electron beam tubes 43B. The first, the second, and the third electron beam tubes 43A, 43B, and 43C can be controlled on a group-by-group basis. Each electron beam tube has a transmission window of electron beams exposed to an interior of the processing chamber 41, wherein the transmission window is sealed by, e.g., transparent quartz glass. A grid-shaped detecting unit 50 is provided below the transmission windows in the manner of facing the transmission windows. Doses of electron beams are detected based on electrons impacted against the detecting unit 50 and the detection signals are inputted to the controller 44. Then, the controller 44 controls on a group basis outputs of the concentrically arranged first, second, and third electron beam tubes 43A, 43B, and 43C in response to detection signals of the detecting unit 50.

The SOD film used in the preferred embodiment is made of, e.g., an organic material. A low-k material having a smaller dielectric constant than that of $SiO_2$ is used as the organic material forming the SOD film, for example. A low-k organic material containing silicon (Si), carbon (C), hydrogen (H), oxygen (O) can be used. Such an organic material may include, e.g., a poly arylene ether (PAE) resin such as polyorganosiloxane cross-linked benzocyclobutene (BCB) resin, SiLK (brand name) of Dow Chemical Company and FLARE (brand name), organic polysiloxane resin such as methyl silsesquioxane (MSQ) and the like. The MSQ-based organic material includes, e.g., LKD which is a product of JSR Corporation.

Hereinafter, operation of the EB processor 40 will be described. The gate valve 47 is opened when the wafer W having an SOD film formed thereon is transferred to the EB processor 40 via an arm of a transfer mechanism (not shown). Then, the transfer arm transfers the wafer W into the processing chamber 41 through the loading/unloading opening 41A. Next, the wafer W is loaded on the mounting table 42 that is on standby in the processing chamber 41. Thereafter, the transfer arm is retracted out of the processing chamber 41, and the gate valve 47 is closed so that the interior of the processing chamber 41 can be maintained in a vacuum state. In the meantime, the mounting table 42 moves upward by the elevation mechanism 45 to maintain a desired spacing between the wafer W and the electron beam units 43.

Next, the air in the processing chamber 41 is evacuated using a vacuum pump. At the same time, the gas supplier supplies a noble gas (e.g., Ar gas) into the processing chamber 41, and thereby replacing the air in the processing chamber 41 with the Ar gas. Further, a predetermined pressure of the Ar gas is maintained in the processing chamber 41. At this time, the heater 42A of the mounting table 42 heats the wafer W and maintains a predetermined temperature thereof. Then, the electron beam tubes 43A, 43B, and 43C of the electron beam unit 43 respectively output electron beams B of an equally preset power to perform the EB curing process on the SOD film formed on the surface of the wafer W.

Figure 4:
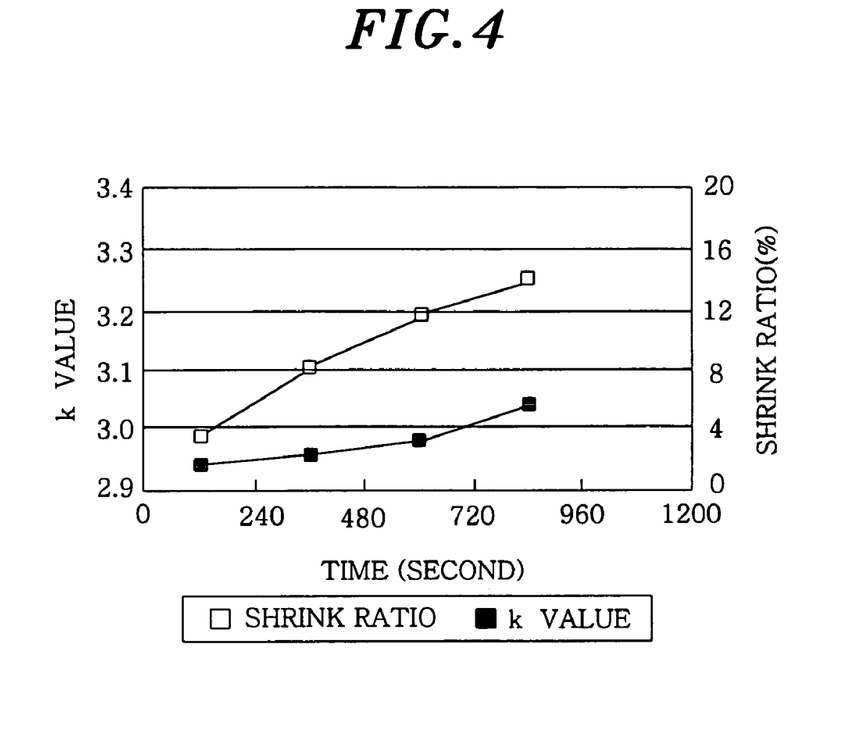
FIG. 4 depicts a graph showing relationships among an SOD film processing time, a shrink ratio and a k (dielectric constant) value, which are obtained by setting a same output for each electron beam tube of an electron beam unit of the EB processor.
Figure 5:
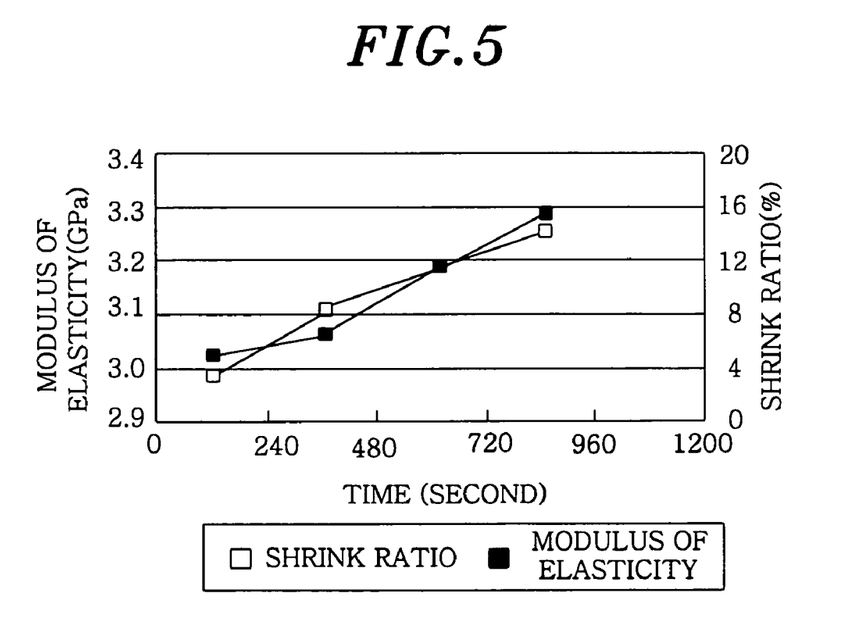
FIG. 5 provides a graph illustrating relationships among an SOD film processing time, a shrink ratio and a modulus of elasticity, which are obtained by setting a same output for each electron beam tube of the electron beam unit of the EB processor.

By setting the outputs from the electron beam tubes 43A, 43B, and 43C to be equal to each other as described above and imposing the following condition while performing the EB curing process, the SOD film having properties illustrated in FIGS. 4 and 5 can be obtained:

[Processing Condition]
Material used as the SOD film: LKD (product of JSR Corporation)
Average film thickness: 5000 Å
Pressure in the processing chamber: 10 Torr
Wafer temperature: 350° C.
Ar gas: 3000 sccm
Distance between the electron beam tubes and the wafer: 75 mm
Electron beam tubes
Applied voltage: 13 kV
Tube current: 250 μA As shown in FIG. 4, a reduction ratio of the SOD film (a film thickness shrink ratio) increases as the EB curing processing time is increased. On the other hand, a k value (a relative dielectric constant) gradually increases until the EB curing processing time reaches 600 seconds and then rapidly increases after 600 seconds. Furthermore, as shown in FIG. 5, a modulus of elasticity of the SOD film also increases with an increase of the EB curing processing time, in a similar manner as in the shrink ratio, resulting in the hardening of the SOD film. The shrink ratio of the SOD film appears to increase since reaction of organic high molecular compounds of the SOD film progresses with an increase of the dose on the SOD film. From the above, it follows that the k value can be maintained to be low if the shrink ratio is maintained within a certain range, e.g., less than or equal to 12% in this preferred embodiment, which corresponds to 600 seconds of EB curing processing time. This implies that the shrink ratio of the SOD film can be varied while maintaining the low k value, which enables the film thickness distribution to be regulated to thereby obtain a uniform film thickness. The regulation of film thickness distribution can be achieved either by adjusting beam irradiation times of the electron beam tubes 43A, 43B, and 43C in case the output powers thereof are identical or by varying the output powers in case the processing times thereof are identical.

In this preferred embodiment, therefore, the output powers of the electron beam tubes 43A, 43B, and 43C are preferably controlled on a group-by-group basis according to the SOD film thickness, thereby regulating the SOD film thickness distribution and achieving a uniform film thickness. Herein, output powers of the electron beam tubes in one group are preferably set to be equal to each other, while an output power of an electron beam tube in one group differs from that in another group. For instance, each third electron beam tube 43C is set to have a highest output power to irradiate a large dose of electron beams onto an outer peripheral portion having a large film thickness, which increases the shrink ratio thereof. On the other hand, the first electron beam tube 43A is set to have a lowest output power to supply a small dose of electron beam to a center portion having a small film thickness, which reduces the shrink ratio thereof. As a result, the SOD film thickness can be regulated.

A thin film processing method of the present invention carried out by the thin film processing system based on the aforementioned principle will now be described. First, a source material of the SOD film is coated on the surface of the wafer W by using the spin coater 10. Then, a heat treatment is performed by using the bake oven 20. Next, by using the film thickness measuring device 30 such as an interferometric film thickness sensor, thickness of the SOD film is measured at various spots across the entire surface of the wafer W. As a result, a film thickness distribution can be detected., which shows a rise from a center portion of the SOD film toward an outer peripheral portion thereof as illustrated by a solid line in FIG. 6A. Numeric data indicating such a film thickness distribution is stored in a memory (not shown) of the controller 44 of the EB processor 40.

Subsequently, the wafer W whose film thickness distribution has been analyzed is transferred into the processing chamber 41 of the EB processor 40 and then loaded on the mounting table 42, as illustrated in FIG. 1. Then, the gate valve 47 is closed and the mounting table 42 moves upward to maintain a predetermined distance between the electron beam unit 43 and the wafer W. Next, a noble gas is supplied into the processing chamber 41 via the gas supply line 48 while the air in the processing chamber 41 is exhausted through the gas exhaust line 49, and a noble gas atmosphere of predetermined pressure is obtained in the processing chamber 41.

Thereafter, power is applied to the electron beam tubes 43A, 43B, and 43C of the electron beam unit 43. At this time, the controller 44 controls an individual output of the electron beam tubes 43A, 43B, and 43C on a group-by-group basis according to the film thickness distribution illustrated in FIG. 6A. That is, as indicated by a solid line in FIG. 6B, the first electron beam tube 43A is set to have a lowest output power to minimize the electron beam dose at the center portion of the SOD film while each third electron beam tube 43C is set to have a highest output power to maximize each electron beam dose at an outer peripheral portion of the SOD film under the control of the controller 44 according to the film thickness distribution of the SOD film, and the EB curing process is carried out on the SOD film in that condition. As a result of the EB curing, the shrink ratio of the SOD film has a minimum value at the center portion thereof, and gradually increases as it goes from the center portion toward the outer peripheral portion thereof. Consequently, the SOD film thickness is leveled over the entire surface of the wafer W and a uniform film thickness can be obtained, as illustrated in FIG. 6C.

As described above, in this preferred embodiment, the SOD film is formed on the wafer W by using the spin coater 10. And the heat treatment is performed on the SOD film by using the bake oven 20. Then, the thickness of the SOD film is measured by the film thickness measuring device 30. Based on the measurement result, the electron beam tubes 43A, 43B, and 43C are individually controlled on a group-by-group basis such that the first electron beam tube 43A and each third electron beam tube 43C emit the lowest and the highest output powers, respectively. Therefore, even if the thickness of the SOD film formed on the wafer W processed by the bake oven 20 gradually increases from the center portion toward the outer peripheral portion thereof, the film thickness distribution can be corrected through the EB curing process and, therefore, the SOD film having a uniform thickness can be obtained. Therefore, the production yield can be enhanced since a favorable process result can be obtained in a subsequent, e.g., etching process carried out after the thin film processing described above.

Figure 6A:
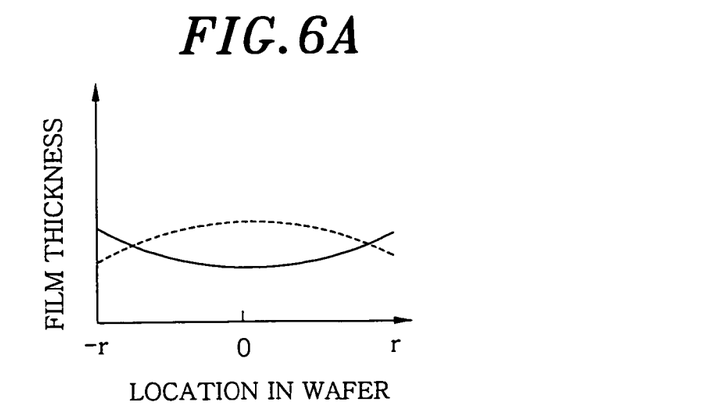
FIG. 6A shows a graph for illustrating a thickness distribution of the SOD film on a wafer after a baking process.
Figure 6B:
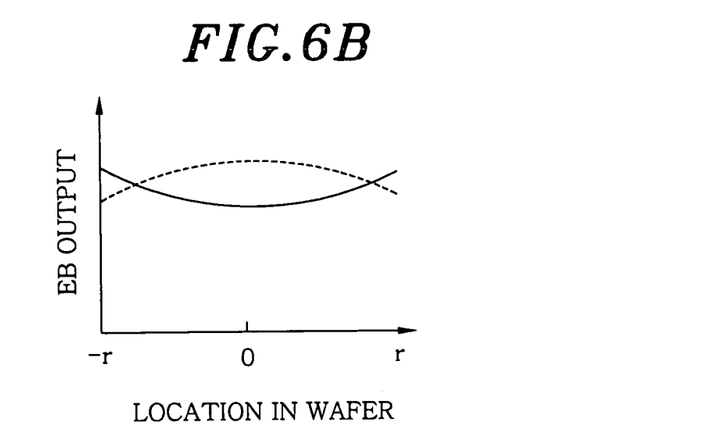
FIG. 6B shows an output distribution of the respective electron beam tubes of the electron beam unit.
Figure 6C:
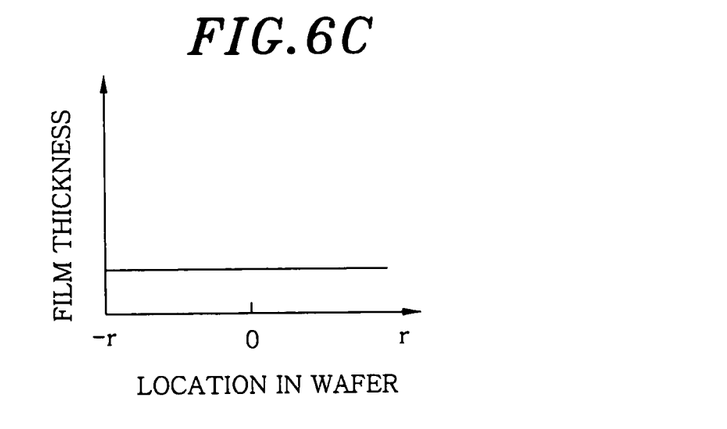
FIG. 6C shows a thickness distribution of the SOD film on the wafer after an EB curing process.

In case the film thickness distribution indicated by a dashed line in FIG. 6A is obtained by the film thickness measuring device 30, the EB curing process is performed under the condition described below. By the controller 44, the first electron beam tube 43A is set to have a highest output power to maximize the electron beam dose at the center portion of the SOD film and each third electron beam tube 43C is set to have a lowest output power to minimize the electron beam dose at the outer peripheral portion thereof according to the SOD film thickness distribution, as illustrated by a dashed line in FIG. 6B, to thereby perform the EB curing process on the SOD film. Accordingly, a shrink ratio of the SOD film has a highest value at the center portion of the wafer W and gradually decreases from the center portion toward the outer peripheral portion thereof. Consequently, a uniform thickness of the SOD film can be obtained over the entire surface of the wafer W as seen in FIG. 6C.

Further, in case an interlayer insulating film is coated on a wafer surface by using a plasma CVD apparatus, a minute irregularity may be distributed on an entire surface of the interlayer insulating film. In this case, the irregularity distribution is detected by the film thickness measuring device 30. Then, output powers of the electron beam tubes 43A, 43S, and 43C of the EB processor 40 are individually controlled based on the film thickness distribution so that the film thickness can be corrected to achieve uniformity, While three groups (i.e., the first electron beam tube 43A, and the second and the third electron beam tubes 43B and 43C) of the electron beam units 43 are respectively controlled on a group-by-group basis in is the above-described preferred embodiment, in this case each output power of the 19 electron beam tubes 43A, 43B, and 43C is individually controlled. Through the use of such control scheme, any type of film thickness distribution can be cured to obtain a uniform film thickness. As a result, this preferred embodiment can provide a same operational effect as that of the above-described preferred embodiment.

Even though the above preferred embodiments have been described with respect to the case where the EB processor 40 is used for leveling irregular thickness of a film obtained after a film forming process, the EB processor 40 can also be used for removing electric charges accumulated on the wafer surface while the wafer is processed by, e.g., a plasma processing apparatus (e.g., a CVD apparatus, an etching apparatus, and an ashing apparatus), an ion implanter, and the like. A charge neutralization function of the EB processor 40 was verified by using a charging monitor wafer.

Figure 7A:
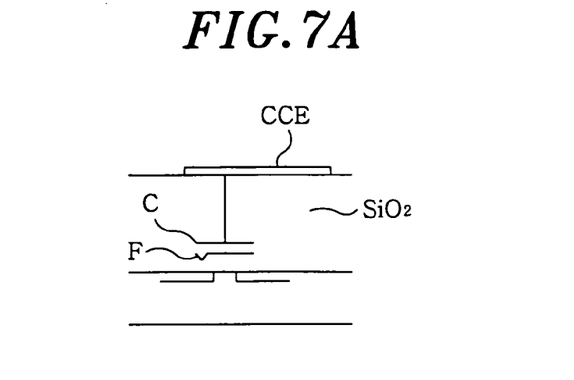
FIGS. 7A and 7B represent conceptual diagrams showing principal parts of a CHARM wafer.
Figure 7B:
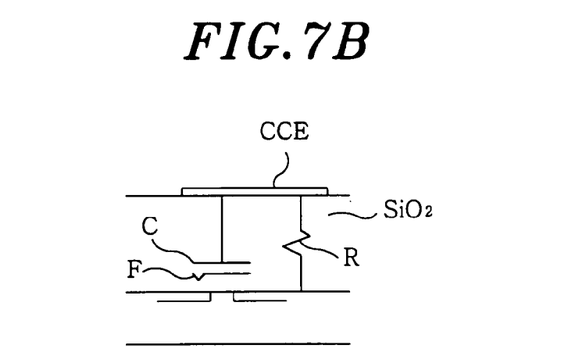

In this preferred embodiment, for example, a CHARM (registered trademark)-2 wafer (a product of Wafer Charging Monitors, Inc.) (hereinafter, referred to as the "CHARM wafer") was used as a charging monitor wafer. The CHARM wafer has EEPROM device structure chips on an entire surface thereof. Each device has a voltage sensor (see FIG. 7A), a current sensor (see FIG. 7B), and a UV sensor (not shown) Further, as illustrated in FIGS. 7A and 7B, each sensor has a control gate C, a floating gate F, and a silicone oxide layer $SiO_2$. Further, charge collection electrode (CCE) is arranged on a surface of each sensor. Electrons are transferred to or removed from the floating gate F through the oxide layer, according to a polarity and a magnitude of a voltage applied to the control gate C of each device. Resultantly, a threshold voltage $V_{th}$ of a transistor varies and a distribution of electric charges of the wafer can be detected based on the amount of variation thereof.

For example, a CHARM wafer (CW) charged with a positive voltage of +14.11 V by the EEPROM was installed in the EB processor 40. Electron beams were irradiated from a plurality of electron beam tubes 43A, 43B, and 43C to the CHARM wafer in an Ar atmosphere, and the CHARM wafer was processed for six minutes under the following processing condition. Next, the CHARM wafer was taken out of the processing chamber 41 and then a voltage distribution of the CHARM wafer was examined. According to the examination result, the voltage changed from +14.11 V to +2.99 V on an average, which shows that positive charges on the wafer can be removed. Further, when a CHARM wafer charged with a negative voltage of −8.26 V was installed in the EB processor 40 and the same process was performed thereon, the voltage changed from −8.62 V to −1.29 V on an average. Such result proves that the EB processor 40 is able to remove any electric charges from the wafer regardless of polarity.

[Processing Condition]
Pressure in the processing chamber: 10 Torr
Wafer temperature: 350° C.
Ar gas: 3000 sccm
Distance between electron beam tubes and a wafer: 75 mm
Electron beam tubes
Applied voltage: 13 kV
Tube current: 250 μA As described above, the EB processor 40 is able to remove any electric charges from the wafer in the Ar atmosphere regardless of polarity by irradiating electron beams onto the wafer. The electricity neutralization appears to be achieved since the Ar gas becomes a plasma by the electron beams, so that positive charges and negative charges are generated, and then positive and negative charges on the wafer surface are neutralized by thus generated positive and negative charges. Further, since the electron beams can penetrate into thin film layers on the wafer, positive charges accumulated even inside the interlayer insulating film can also be removed. The minor irregularity of the interlayer insulating film can also be concurrently leveled by the electron beams.

Figure 8:
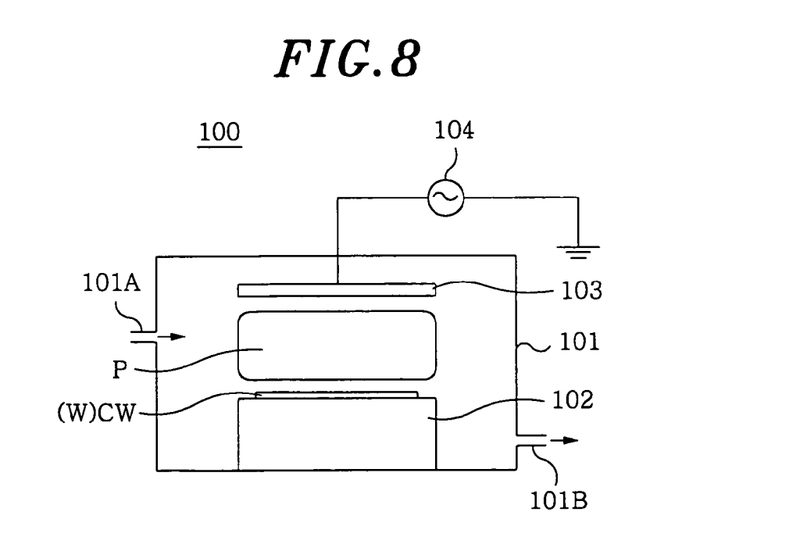
FIG. 8 offers a conceptual diagram of an exemplary plasma processing apparatus.

Subsequently, charging characteristics of a plasma CVD apparatus, depicted in FIG. 8 for example were examined by using a CHARM wafer. As can be seen from FIG. 8, the plasma CVD apparatus 100 has a processing chamber 101; a mounting unit 102 installed in the processing chamber 101, for mounting a wafer W; an electrode 103 installed above the mounting unit 102 so as to face a top portion of the mounting unit 102; and a high frequency power supply 104 connected to the electrode 103. Installed at a top portion and a bottom portion of the processing chamber 101 are a gas supply port 101A of a process gas and a gas exhaust port 101B connected to a vacuum pump (not shown), respectively. In case of forming a silicon oxide layer an interlayer insulating film by using the plasma CVD apparatus 100, ($SiH_4+N_2O$) based gas or ($TEOS+O_2$) based gas, for example, can be used as a process gas. In this case, the wafer W is electrically charged by receiving electric charges from the plasma during the film forming process.

In order to examine the charging characteristics of the plasma CVD apparatus 100, a predetermined magnitude of positive voltage or negative voltage is applied to the control gates C of the CHARM wafer CW through EEPROM. Next, the CHARM wafer CW is loaded on the mounting unit 102 of the plasma CVD apparatus 100 as shown in FIG. 8 and then processed under a process condition of forming the interlayer insulating film. That is to say, the process gas (e.g., $TEOS+O_2$-based gas) is supplied from the gas supply port 101A into the processing chamber 101 and, at the same time, the processing chamber 101 is evacuated through the gas exhaust port 101B, to thereby set the processing chamber 101 at a certain pressure. Subsequently, a high frequency power is applied from the high frequency power supply 104 to the electrode 103, to produce a plasma P of the process gas in the processing chamber 101 and the CHARM wafer CW is electrically charged. Thereafter, the CHARM wafer CW is taken out of the processing chamber 101. Then, positive or negative voltages are read from the voltage sensors of the CHARM wafer CW in order to detect changes thereof due to the charging from the plasma. Accordingly, it is possible to analyze the charging characteristics of the plasma CVD apparatus 100 by the processing described above. The charging characteristics thus obtained are registered in advance at the controller 44 of the EB processor 40.

In case of removing electric charges by the EB processor 40 after plasma CVD processing, the wafer is transferred from the plasma CVD apparatus 100 into the EB processor 40 and, then, electric charges are removed by the EB processor 40. At this time, the electron beam tubes of the unit 43 of the EB processor 40 are individually controlled based on the charging characteristics registered in the controller 44, so that the electric charges can be efficiently removed from the wafer.

In other words, in order to remove the electric charges from the wafer on which a film is coated by using the plasma CVD apparatus 100, the charging characteristics of the plasma CVD apparatus 100 are registered in advance in the memory of the controller 44 of the EB processor 40; and then the electron beam tubes 43A, 43B and 43C are individually controlled based on the registered characteristics. Thus, the electric charges can be efficiently removed from the wafer surface.

As described above, in this preferred embodiment, electron beams are irradiated from the electron beam tubes 43A, 43B and 43C onto the wafer in the atmosphere of Ar gas in order to remove the electric charges charged in the interlayer insulating film of the wafer. At this time, since the electron beams are irradiated onto the wafer through Ar gas, the Ar gas becomes a plasma by the electron beams, which enables removal of positive and negative charges charged on the surface of the interlayer insulating film. Further, since the electron beams can penetrate into the interlayer insulating film, electric charges therein can also be removed.

This preferred embodiment involves a process for measuring an amount of electric charges charged in the interlayer insulating film of the wafer formed by the plasma CVD apparatus 100 and a process for removing the electric charges by using electron beams irradiated from the electron beam tubes 43A, 43B and 43C onto the interlayer insulating film. When the electron beams are irradiated onto the wafer in the atmosphere of Ar gas, the plurality of electron beam tubes 43A, 43B and 43C are controlled depending on the amount of electric charges charged by the plasma CVD apparatus 100. Since the electron beams are irradiated according to the distribution of the electric charges, the electric charges of the wafer can be effectively removed. If the wafer charged with electricity through the film forming process is taken out of the plasma CVD apparatus 100 and the amount of electric charges is measured, foreign substances in the atmosphere may be attached to the wafer due to static elasticity. Therefore, it is preferable to perform the film forming process, the electric charge measuring process, and the EB charge neutralizing process in a vacuum atmosphere. The term, electric charges charged in a film, used herein represents electric charges charged on the surface of the film as well as those charged inside the film.

The present invention is not limited to the above-described preferred embodiments. For instance, the charge neutralization processing described with respect to the interlayer insulating film can be equally applied to a resist film as well. In addition, though the aforementioned preferred embodiments use a spin coater and a CVD apparatus as exemplary thin film processing apparatus, the present invention can also be applied to other thin film processing apparatuses. Moreover, various EB processors other than the EB processor used in the aforementioned preferred embodiments can be employed by the present invention. Further, in case electric charges are removed from an object to be processed, other noble gas, e.g., xenon, krypton, or helium, than Ar gas can be used. Furthermore, by irradiating electron beams to an object that is electrically charged by, e.g., an etching apparatus, an ion implanter, and the like, other than the plasma CVD apparatus, it is possible to remove the electric charges.

While the invention has been shown and described with respect to the preferred embodiments, it will be understood by those skilled in the art that various changes and modifications may be made without departing from the spirit and scope of the invention as defined in the following claims.

What is claimed is:

1. A thin film processing method comprising the steps of:
   irradiating electron beams from a plurality of electron beam tubes onto a film formed on an object to be processed, the film having a varying thickness, to regulate the thickness; and
   forming the film by CVD,
   wherein output powers or beam irradiation times of the electron beam tubes are individually controlled according to a distribution of the thickness.

2. A thin film processing method comprising the step of:
   irradiating electron beams from a plurality of electron beam tubes onto a film formed on an object to be processed, the film having a varying thickness, to regulate the thickness,
   wherein output powers or beam irradiation times of the electron beam tubes are individually controlled according to a distribution of the thickness, and
   wherein an electron beam tube disposed at an outer portion of the object has a higher output power than an electron beam tube disposed at an inner portion of the object.

3. A thin film processing system comprising:
   a film thickness measuring device for measuring a thickness of a film formed on an object to be processed; and
   an electron beam processor including a plurality of electron beam tubes for irradiating electron beams onto the film of the object and a controller for individually controlling output powers or beam irradiation times of the electron beam tubes based on a measurement result taken by the film thickness measuring devices,
   wherein the electron beam tubes are substantially concentrically disposed.

4. The thin film processing system of claim 3, further comprising a spin coater for forming the film on the object.

5. The thin film processing system of claim 3, further comprising a plasma processing apparatus for forming the film on the object.

6. The thin film processing system of claim 3, wherein the controller is configured, by individually controlling output powers or beam irradiation times of the electron beam tubes, to vary electron beam doses over the object to be processed so as to regulate the film thickness.

7. The thin film processing system of claim 3, wherein the film thickness measuring device comprises an interferometric film thickness sensor.

* * * * *